(12) United States Patent
Daudon et al.

(10) Patent No.: US 11,571,951 B2
(45) Date of Patent: Feb. 7, 2023

(54) CONNECTOR SYSTEM AND HEATER SYSTEM

(71) Applicant: Mahle International GmbH, Stuttgart (DE)

(72) Inventors: Guillaume Daudon, La Bourgonce (FR); Nicolas Edel, Soultz (FR); Gilles Magnier, Rougemont-le-Chateau (FR); Eric Marlier, Kolbsheim (FR); Jerome Stoeckel, Bollwiller (FR)

(73) Assignee: Mahle International GmbH

( * ) Notice: Subject to any disclaimer, the term of this patent is extended or adjusted under 35 U.S.C. 154(b) by 395 days.

(21) Appl. No.: 16/830,171

(22) Filed: Mar. 25, 2020

(65) Prior Publication Data
US 2020/0307353 A1 Oct. 1, 2020

(30) Foreign Application Priority Data

Mar. 26, 2019 (EP) .................................... 19165181

(51) Int. Cl.
*B60H 1/22* (2006.01)
*H01R 12/71* (2011.01)
(Continued)

(52) U.S. Cl.
CPC ......... *B60H 1/2218* (2013.01); *H01R 12/716* (2013.01); *H01R 13/6315* (2013.01); *H05K 1/181* (2013.01); *H05K 2201/10189* (2013.01)

(58) Field of Classification Search
CPC B60H 1/2218; H01R 12/716; H01R 13/6315; H01R 12/7076; H01R 12/91;
(Continued)

(56) References Cited

U.S. PATENT DOCUMENTS 9,234,677 B2 * 1/2016 Clade ................... H05K 1/0203
9,915,441 B2 * 3/2018 Kohl ..................... F24H 9/1872
(Continued)

FOREIGN PATENT DOCUMENTS

CN 102183680 A 9/2011
CN 102771015 A 11/2012
(Continued)

OTHER PUBLICATIONS

English abstract for FR-3032388.
Chinese Office Action dated Mar. 31, 2021 related to corresponding Chinese Patent Application No. 202010190903.6.

*Primary Examiner* — Abdullah A Riyami
*Assistant Examiner* — Nader J Alhawamdeh
(74) *Attorney, Agent, or Firm* — Fishman Stewart PLLC

(57) ABSTRACT

The present disclosure concerns a connector system, e.g., for connecting an electrical component with a circuit board. The connector system includes an electrical heater-function-component having an electrical component-contact-surface for an electrical connection of the electrical heater-function-component. A circuit-board having an electrical board-contact surface is provided for an electrical connection of the circuit-board. A connector assembly connects the heater-function-component with the circuit-board. The connector assembly is arranged at the electrical component-contact-surface and the electrical board-contact-surface for connecting the heater-function-component with the circuit-board.

20 Claims, 5 Drawing Sheets

(51) Int. Cl.
*H01R 13/631* (2006.01)
*H05K 1/18* (2006.01)

(58) Field of Classification Search
CPC ...... H01R 13/04; H01R 13/11; H01R 13/502; H01R 24/00; H01R 2201/26; H05K 1/181; H05K 2201/10189; F24H 3/0441; F24H 9/1872; H05B 2203/02; H05B 3/06; H05B 3/22
See application file for complete search history.

(56) References Cited

U.S. PATENT DOCUMENTS

| | | | |
|---|---|---|---|
| 2004/0112884 A1* | 6/2004 | Uhl | H05K 1/0206 |
| | | | 219/202 |
| 2007/0114217 A1* | 5/2007 | Bohlender | F24H 3/0464 |
| | | | 219/202 |
| 2009/0020515 A1* | 1/2009 | Clade | F24H 3/0464 |
| | | | 219/202 |
| 2019/0081439 A1 | 3/2019 | Schneider et al. | |
| 2020/0067234 A1* | 2/2020 | Schneider | H01R 12/585 |

FOREIGN PATENT DOCUMENTS

| | | |
|---|---|---|
| FR | 3032388 A1 | 8/2016 |
| WO | WO-2019122616 | 6/2019 |

* cited by examiner

CONNECTOR SYSTEM AND HEATER SYSTEM

CROSS REFERENCE TO RELATED APPLICATION

This application claims priority to European Patent Application No. 19165181.9 filed Mar. 26, 2019, the contents of which are hereby incorporated by reference in its entirety.

TECHNICAL FIELD

The invention relates to a connector system. The invention further relates to a heater system, in particular a PTC-heater system for a vehicle.

BACKGROUND

Such connector systems and heater systems are commonly known and usually used in particular in vehicles for heating air or the like.

However, the mounting of such a connector system or such a heater system is in many cases inconvenient. In particular, many mounting steps are necessary for the positioning and installing of heater bodies on a circuit-board within a heater system housing. Especially connecting or inserting the heater bodies to the circuit-board is difficult due to the fragile heater bodies, by way of example, the heater bodies have sensitive insulation ceramics and might break if slightly stressed. For example, the standard thickness for insulation ceramic is about 0.63 mm to usually 0.8 mm.

SUMMARY

Hence, the object of the present invention is to provide an improved connector system and heater system.

To achieve this object, a connector system of the above-mentioned type is provided. The connector system comprising an electrical heater-function-component having an electrical component-contact-surface for the electrical connection of the heater-function-component. Furthermore, the connector system comprising a circuit-board having an electrical board-contact-surface for the electrical connection of the circuit-board. The heater-function-component is for exempla a PTC heater element or the like.

Moreover, an adaptably and/or flexible connector-assembly for flexible connecting the heater-function-component with the circuit-board is provided, wherein the connector-assembly is arranged at the heater-component-contact-surface and at the board-contact-surface for flexible connecting the heater-function-component with the circuit-board. The connector-assembly is preferably designed adaptably and flexible so that fragile heater-function-components and/or fragile circuit-board are protected against destruction, by way of example, the heater-function-components and/or fragile circuit-board are covered with a thin fragile ceramic insulation or the like.

For example the connector-assembly is flexible and can adapt to the orientation and/or the position of the insulation ceramic of the heater-function-components, by what it will not break during assembly or during vibration test or the like.

Anyway, with this configuration or by means of it, it may arise the advantage that heater bodies connected to the heater-function-component can be installed without damaging the fragile heater-function-components and/or fragile circuit-board. Furthermore, it may arise that the heater-function-components powered correctly in order to ensure to pass life time endurance.

It may also arise the following additional advantages:
Flexible solution to avoid breaking the insulation ceramic
Good flexibility during vibration test
Flexible solution: any geometry of the insulation ceramic can be adapted
In order to connect the insulation ceramic of the heater-function-component to the circuit-board, a connector is provided, which will contact the parts without stressing the insulation ceramic to avoid breaking.

It is possible that the adaptable and/or flexible connector-assembly is capable for connecting any other electrical component with the circuit-board.

Furthermore it is possible that the circuit-board is for example a PCB-board. The PCB-board controls and drives one or more PTC heater elements. For example the PCB-board regulates the entire heater or the heater-function-component.

It is possible that a connector, maybe the spring connector and/or the counterpart body, are soldered to the insulation ceramic of the heater-function-components so that the counterpart body can clipped to the connector.

One could say that the connector-assembly is flexible to avoid breaking the insulation ceramic of the heater-function-components during assembly and over life time.

It is possible that on the component-contact-surface a spring connector of the connector-assembly is arranged, wherein on the board-contact-surface a counterpart body of the connector-assembly is arranged. Moreover, the spring connector and the counterpart body are designed for cooperation, by way of example, the counterpart body can be sticked into the spring connector. With this configuration, it may arise that the connector-assembly is flexible to use.

It is also possible that on the board-contact-surface a spring connector of the connector-assembly is arranged, wherein on the component-contact-surface a counterpart body of the connector-assembly is arranged. Furthermore, with this configuration, it may also arise that the connector-assembly is flexible to use.

It is expediently provided that the adaptably connector-assembly comprises a spring connector having a connector housing. It is preferred that the connector housing is a box or the like, with a set of walls limiting a free installations connector chamber in particular for the installation of a rib connector assembly described in following sections.

Anyway, inside the connector housing, or particularly inside the installation connector chamber, a joint protrusion is arranged, which defines a longitudinal rotation axis. The spring connector further comprises a rib connector assembly arranged on the joint protrusion. Thereby the connector assembly, in particular the rib connector assembly in combination with the connector housing, is prepared to receive a counterpart body.

A favourable arrangement provides that the rib connector assembly is linear movably and/or rotatably mounted on the joint protrusion, in particular referring to the longitudinal rotation axis. With this configuration or by means of it, it may arise the advantage that the fragile heater-function-components and/or fragile circuit-board can be installed without damaging the fragile heater-function-components and/or fragile circuit-board because the rib connector assembly is designed to cling itself to each heater-function-component and/or a circuit-board.

A favourable arrangement provides that rib connector assembly having one or more rib connectors, which are linear movably and/or rotatably mounted on the joint protrusion, in particular referring to the longitudinal rotation axis. With this configuration, it may arise the advantage that each rib connector assembly is moveable and/or rotatable independently so that it can cling itself independently to a heater-function-component and/or a circuit-board.

Thereby the longitudinal rotation axis defines a stack-direction. The rib connectors are preferred to be stacked on each other in close contact in the stack-direction to build, by way of example, a horizontal rib connector stack.

Each rib connector of the said connector system expediently comprises a connector body having at least one connector body leg, wherein two connector body legs defining a clamp gap. The clamp gap is prepared for receiving and fixing a counterpart body.

It is preferred if the said connector system has two further connector body legs. The two connector body legs are preferably designed to interact with the connector housing for limiting the linear and/or rotatory movement of the rib connector.

An advantageous embodiment provides that the said rib connector assembly or one ore each rib connector of the said rib connector assembly is made of electrically conductive materials, in particular copper, copper alloy or a silver alloy.

It is preferably provided that the said counterpart body is a protrusion body, in particular a cylindrical body, a rectangular block body or a sword body, soldered into the component-contact-surface or the board-contact-surface.

Another embodiment of the invention proposes that the spring connector of the said connector-assembly preferably has an elastic and electrically conductive pin body for electrically connecting the component-contact-surface and the board-contact-surface, wherein the spring connector is elastically prestressed arranged between the component-contact-surface and the board-contact-surface for electrically connecting the component-contact-surface and the board-contact-surface.

One could say the conductive pin body is a connection wire, which is flexible. In particular the conductive pin body or the wire could be soldered on the insulation ceramic of the heater-function-component and elastically prestressed clipped to the circuit-board.

However, it is preferred if the said spring connector further comprises a receiving connector for receiving a counterpart body, wherein the receiving connector is connected to the elastic pin body.

One could also say the conductive pin body is a connection spring wire or a connection spring, which is flexible and can adapt vibrations.

Maybe, a spring contact is soldered on the insulation ceramic of the heater-function-component on one side to a copper pad and linked to the circuit-component on the other side, in particular in a copper pad.

It is advantageously provided that the said pin body is an elastic wire or an elastic spring or an elastic spring shaped wire.

It is preferably provided that the component-contact-surface and/or the board-contact-surface are arranged on or formed of a pad, in particular a copper pad, which is a part of the heater-function-component and/or the heater-function-component.

Furthermore, to achieve the object of the present invention, a heater system of the abovementioned type is provided.

Furthermore, to achieve the object of the present invention, a clip for clamping a counterpart body, preferably mounted on the heater-function-component, and the circuit-board can be used.

It is, by way of example, possible that the heater system is a so called "PTC" heater system for a vehicle, while the abbreviation "PTC" stands for "positive temperature coefficient". It is preferably a heater element made of conducting rubber-materials, wherein the rubber-materials resistivity increase with increasing temperature.

It is preferably provided that each pin body is attached, in particular soldered or clipped, to the component-contact-surface and/or the board-contact-surface.

However, the abovementioned heater system comprising a heater system housing and one, two, three or more or a variety of heater-function-components, wherein each heater-function-component comprises at least one or a variety of heater bodies for heating and a connection portion. Maybe, each heater body consists of the beforementioned rubber-material. Furthermore, each connection portion is attached to a heater body for connecting the heater body electrically. The heater system also comprises a circuit-board arranged in the heater system housing having a variety of component-contact-surfaces for the electrical connection of the heater-function-components. It is preferred that the heater system housing is a box or the like, with a set of walls and a cover limiting a free installations chamber in particular for the installation of circuit-boards and heater-function-components.

The connector-assembly is preferred to be an integral part of the heater-function-component or the circuit-board. It is also expediently provided that the connector-assembly can be a non-integral part of the heater-function-component or the circuit-board, by the way of example, the connector-assembly is an insert-body.

The abbreviation "PTC" stands for "positive temperature coefficient".

The abbreviation "PCB" stands for "printed circuit board". By way of example, a PCB-board is used for connecting electrical components via conductive pads and conductive conductors.

In summary, it remains to be noted that: The invention relates to a connector system, in particular for connecting an electrical component with a circuit-board. The connector system comprises an electrical heater-function-component having an electrical component-contact-surface for the electrical connection of the heater-function-component, an circuit-board having an electrical board-contact-surface for the electrical connection of the circuit-board and an adaptably connector-assembly for flexible connecting the heater-function-component with the circuit-board, wherein the connector-assembly is arranged at the component-contact-surface and at the board-contact-surface for flexible connecting the heater-function-component with the circuit-board.

Further important features and advantages of the invention emerge from the dependent claims, from the drawings and from the associated description of the figures with reference to the drawings.

It goes without saying that the features mentioned above and those which have yet to be explained below can be used not only in the respectively stated combination, but also in different combinations or on their own without departing from the scope of the present invention.

Preferred exemplary embodiments of the invention are illustrated in the drawings and are explained in more detail in the description below, wherein the same reference signs refer to identical or similar or functionally identical components.

BRIEF DESCRIPTION OF THE DRAWINGS

In the following, preferred embodiments of the invention are described using the drawing. This shows as follows.

DETAILED DESCRIPTION

The exemplary embodiment relates to a connector system 10, in particular for connecting an electrical component with a circuit-board.

Figure 1:
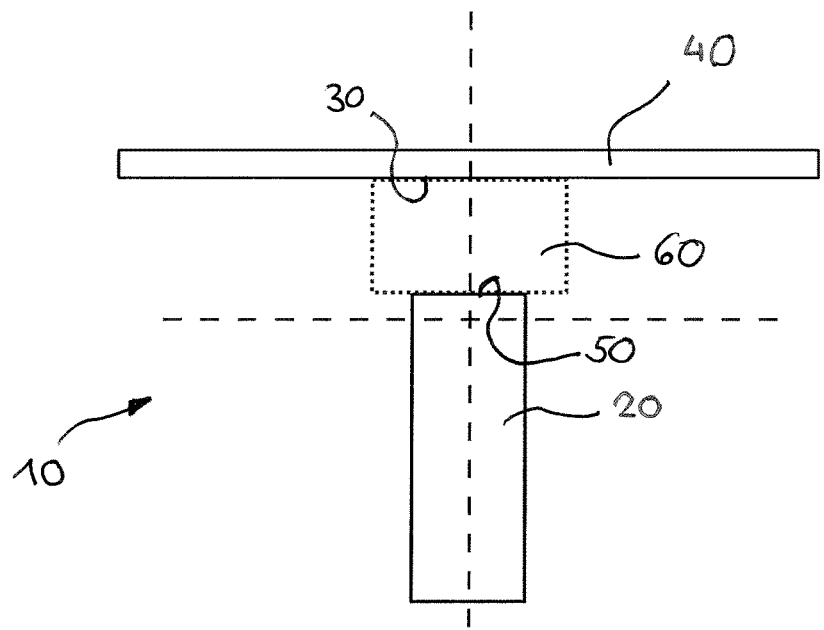
FIG. 1 A side view of a connector system.

The said connector system 10 is exemplary shown in FIG. 1 comprising an electrical heater-function-component marked with reference 20. The heater-function-component 20 is for example a PTC heater element. Furthermore said connector system 10 has a circuit-board 40, whereby the circuit-board 40 is for example a PCB-board 40 to control and drive one ore more PTC heater elements 20. For example the PCB-board 40 regulates the entire heater or the heater-function-component 20.

Figure 2:
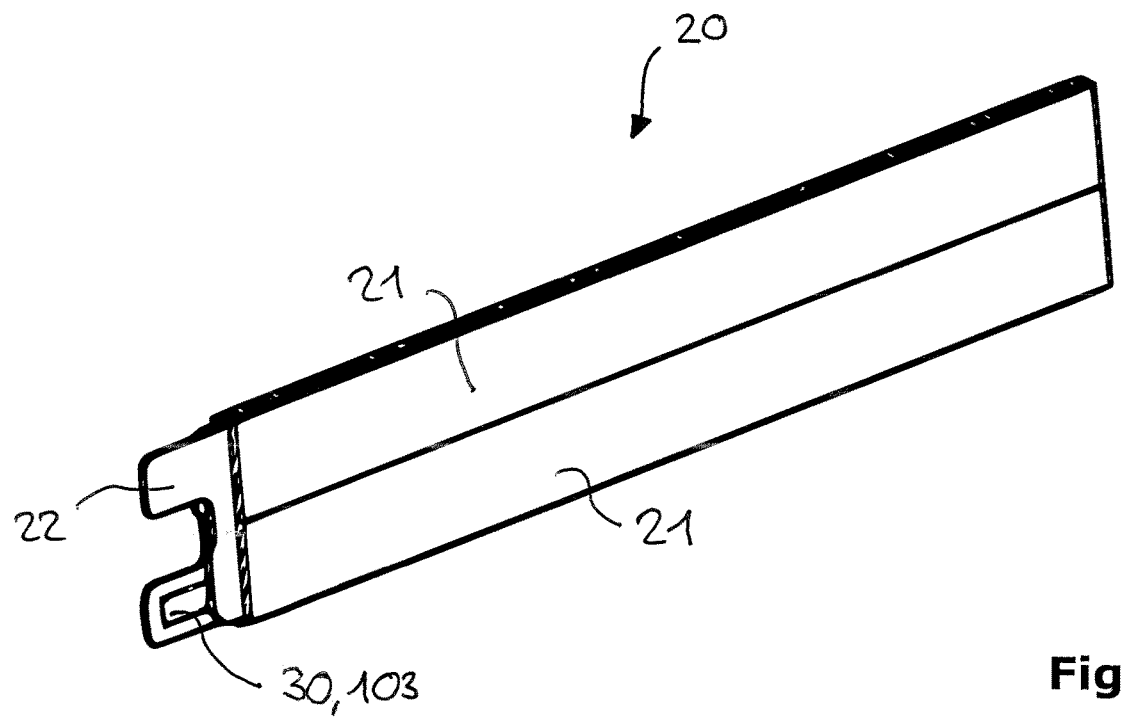
FIG. 2 A perspective view of a heater-function-component.

Furthermore, each heater-function-component 20, by the way of example shown in FIG. 2, comprises one or more electrical component-contact-surfaces 30 for the electrical connection, maybe for the connection to the circuit-board 40.

The circuit-board 40 has one or more electrical board-contact-surfaces 50 for the electrical connection of the circuit-board 40, maybe to a heater-function-component 20.

Moreover, an adaptably connector-assembly 60 for flexible electrical connecting the heater-function-component 20 with the circuit-board 40 is shown in FIG. 1, wherein the connector-assembly 60 is arranged at the component-contact-surface 30 and at the board-contact-surface 50 for flexible connecting the heater-function-component 20 with the circuit-board 40.

A not shown heater system, in particular a PTC heater system for a vehicle, comprising a heater system housing, one or more heater-function-components 20 and an circuit-board 40.

Each heater-function-component 20 comprising at least one or a variety of heater bodies 21 for heating and a connection portion 22. It is preferred if the component-contact-surfaces 30 is located on the connection portion 22. For example the connection portion 22 is coated with a fragile insulation ceramic.

The circuit-board 40 is arranged in the not shown heater system housing having at least one or a variety of component-contact-surfaces 30 for the electrical connection of the heater-function-components 20. It is preferred if each board-contact-surface 50 is located on the circuit-board 40.

Figure 3:
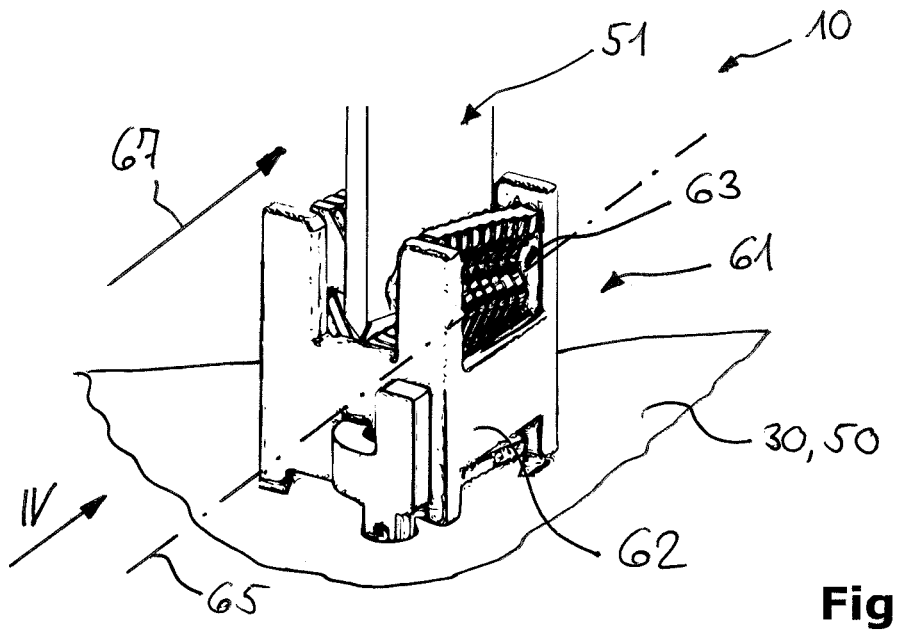
FIG. 3 A perspective view of a connector-assembly comprising a spring connector and a counterpart body.
Figure 4:
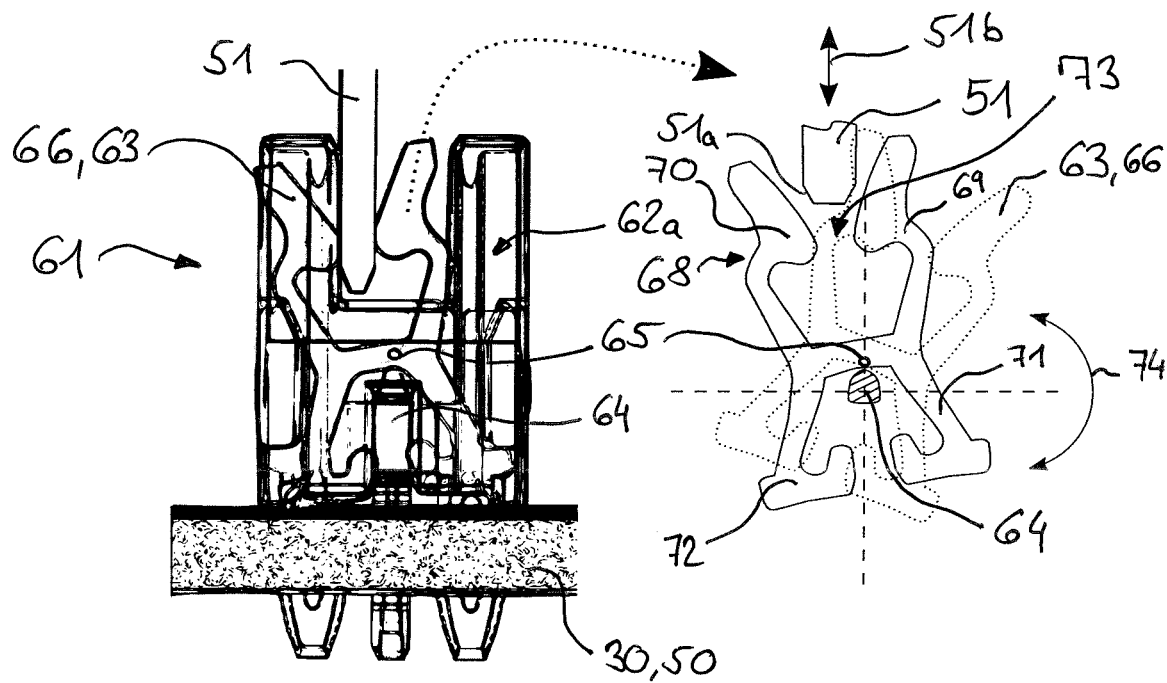
FIG. 4 The connector-assembly pursuant FIG. 3 in a side view according to arrow IV.

As for example shown in FIG. 3, the connector-assembly 60 of said connector system 10 comprises a spring connector 61 on the component-contact-surface 30 or on the board-contact-surface 50. Anyway, the spring connector 61 is capable of receiving and fixing a counterpart body 51. The counterpart body 51 is arranged on the component-contact-surface 30 or on the board-contact-surface 50.

It is expediently provided that the spring connector 61 having a connector housing 62. It is preferred that the connector housing 62 is a box or the like, with a set of walls limiting a free installations connector chamber 62a in particular for the installation of a rib connector assembly 63 described in following sections.

The connector housing 62 has a joint protrusion 64 defining a longitudinal rotation axis 65, wherein on the joint protrusion 64 the rib connector assembly 63 is arranged.

The rib connector assembly 63 is prepared to receive the counterpart body 51, for example a sloped protrusion 51a of the counterpart body 51, for flexible connecting the heater-function-component 20 and the circuit-board 40. The counterpart body 51 is, by the way of example, movable in an installation direction 51b.

Furthermore, the said rib connector assembly 63 comprises one or more relatively flat rib connectors 66, which are linear movably and/or rotatably, in particular referring to the longitudinal rotation axis 65, mounted on the joint protrusion 64 in each case.

Thereby the longitudinal rotation axis 65 defines a stack-direction 67. The rib connectors 66 are stacked on each other in close contact in the stack-direction 67.

Anyway, the said rib connector 66 has a connector body 68 having at least one connector body leg 69, 70, 71, 72, wherein two connector body legs 69, 70 defining a clamp gap 73. The clamp gap 73 is prepared for receiving and fixing the counterpart body 51.

The two further connector body legs 71, 72 are designed to interact with the connector housing 62 for limiting the linear or rotatory movement 74 of the rib connector 66.

As mentioned, the counterpart body 51 is a protrusion body 51a, in particular a cylindrical body, a rectangular block body or a sword body, soldered into the component-contact-surface 30 or the board-contact-surface 50.

Figure 5:
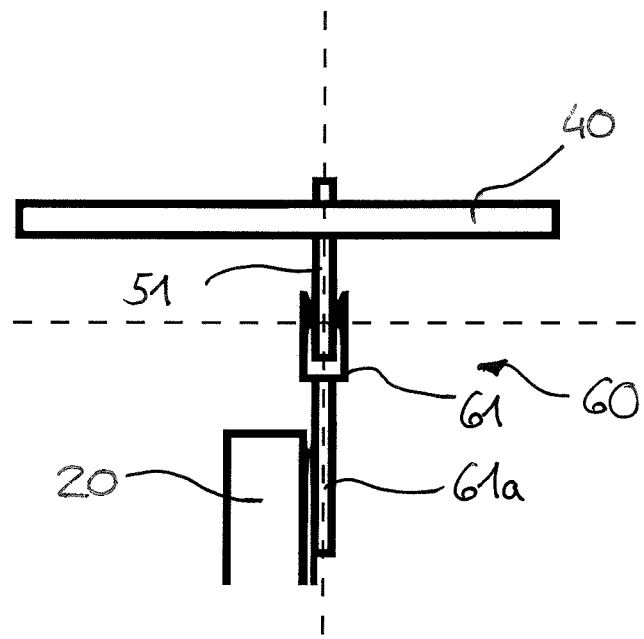
FIG. 5 A schematic view of a further connector system.

Pursuant FIG. 5 a spring connector 61 is arranged on an end face of an extension body 61a, for example a cylindrical body or a sword. Anyway, the extension body 61a is mounted on a board-contact-surface 50. Thereby the counterpart body 51 protrudes from the heater-function-component 20 in the direction of the spring connector 61.

Figure 6:
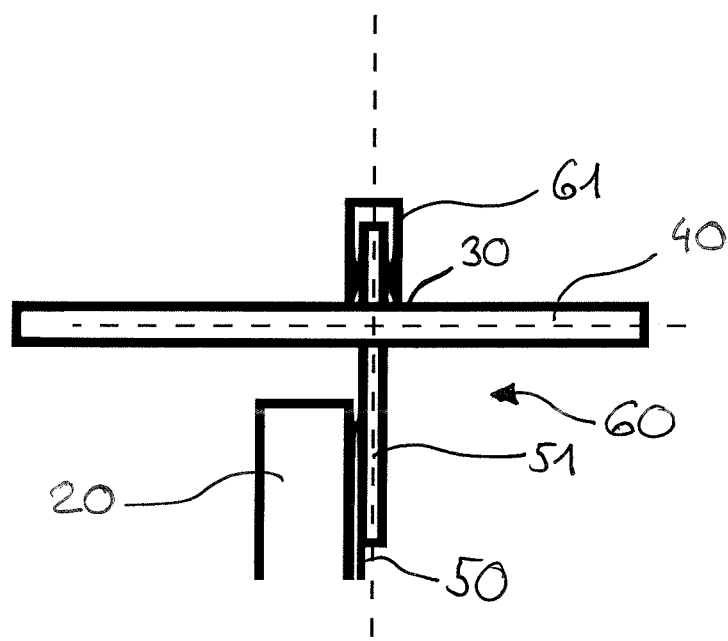
FIG. 6 The connector system pursuant FIG. 5 in a different design.

Pursuant FIG. 6 a spring connector 61 is mounted on the component-contact-surface 30 and the counterpart body 51, for example a sword, is mounted on a board-contact-surface 50. Thereby the counterpart body 51 breaks through the heater-function-component 20.

Figure 7:
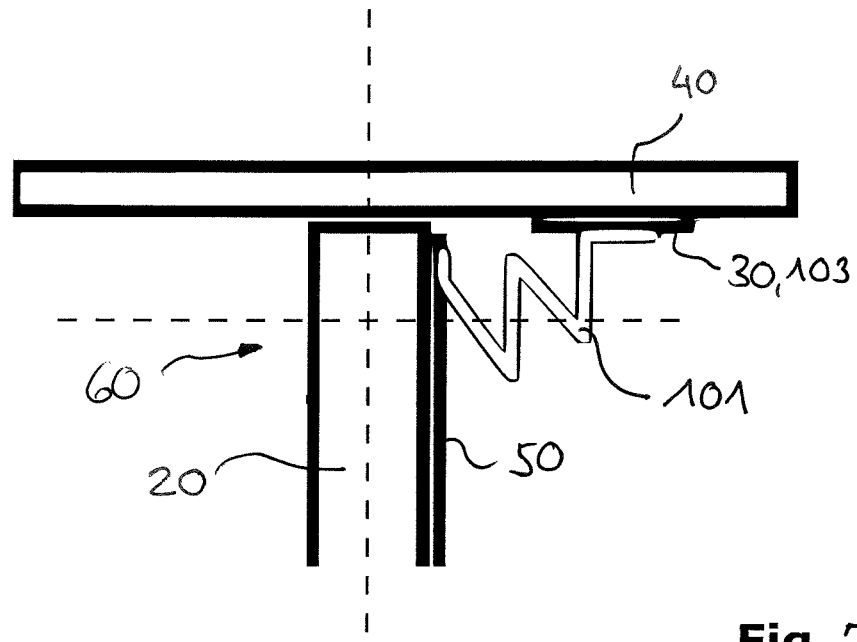
FIG. 7 A schematic view of a further connector system.
Figure 8:
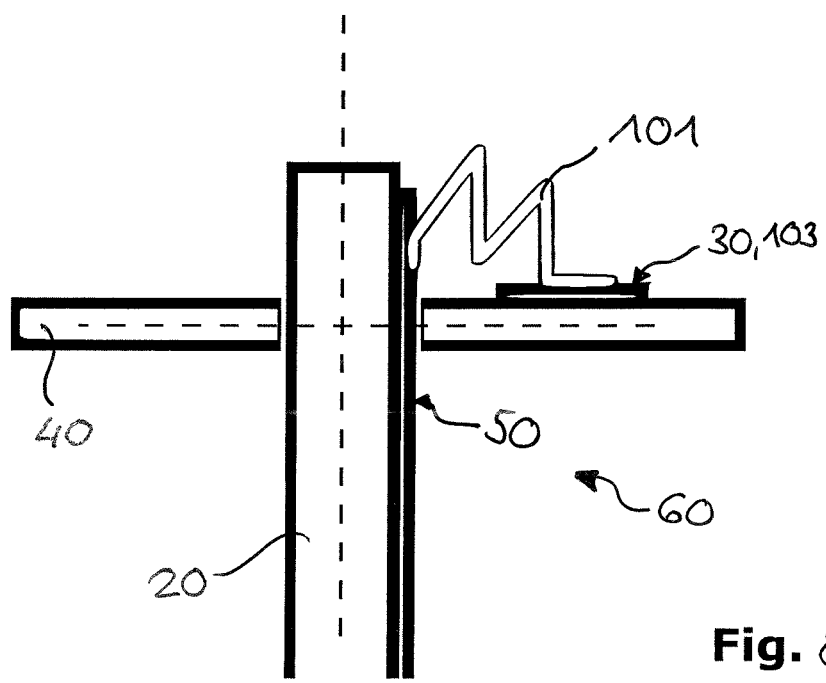
FIG. 8 The connector system pursuant FIG. 7 in a different design.
Figure 9:
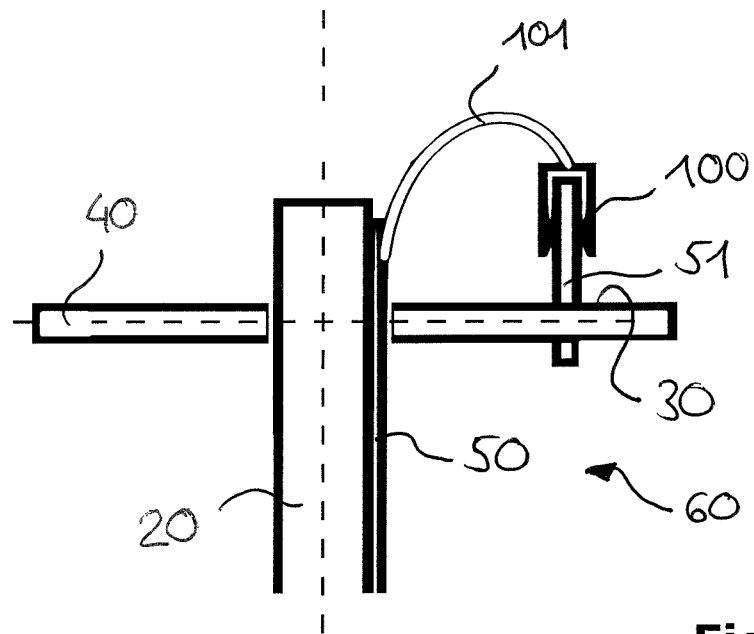
FIG. 9 The connector system pursuant FIG. 7 in a different design.

A further embodiment is shown in FIGS. 7, 8 and 9, wherein a spring connector 61 of the connector-assembly 60 comprises an elastic and electrically conductive pin body 101 for electrically connecting the component-contact-surface 30 and the board-contact-surface 50. The conductive pin body 101 is elastically prestressed arranged between the component-contact-surface 30 and the board-contact-surface 50 for electrically connecting the component-contact-surface 30 and the board-contact-surface 50.

Maybe, the said pin body 101 is an elastic wire or an elastic spring or an elastic spring shaped wire.

Referring to FIG. 9, the component-contact-surface 30 and/or the board-contact-surface 50 comprises each a receiving connector 100 for receiving a counterpart body 51. Thereby the receiving connector 100 is connected to the elastic pin body 101.

Figure 10:
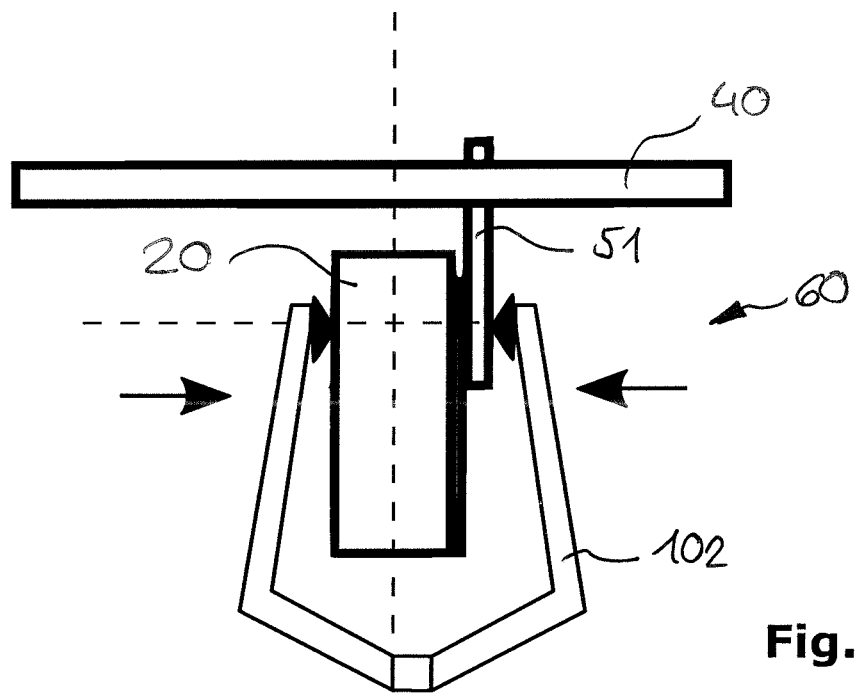
FIG. 10 A schematic view of a further connector system.

Referring to FIG. 10, a further embodiment is show, wherein a spring connector 61 of the connector-assembly 60 comprises a clip 102 for clamping a counterpart body 51, preferably mounted on the heater-function-component 20, and the circuit-board 40.

The invention claimed is:

1. A connector system, comprising:
an electrical heater-function-component having an electrical component-contact-surface for an electrical connection of the electrical heater-function-component,
a circuit-board having an electrical board-contact-surface for an electrical connection of the circuit-board,
an adaptable connector-assembly for connecting the electrical heater-function-component with the circuit-board,
wherein the adaptable connector-assembly is arranged at the electrical component-contact-surface and at the electrical board-contact-surface for connecting the electrical heater-function-component with the circuit-board,
wherein the connector-assembly includes a spring connector that comprises an elastic and electrically conductive pin body for electrically connecting the electrical component-contact-surface and the electrical board-contact-surface, and
wherein the spring connector is elastically prestressed arranged between the electrical component-contact-surface and the electrical board-contact-surface for electrically connecting the electrical component-contact-surface and the electrical board-contact-surface.

2. The connector system according to claim 1,
wherein the adaptable connector-assembly includes a spring connector arranged on the electrical component-contact-surface or on the electrical board-contact-surface,
wherein the adaptable connector-assembly further includes a counterpart body arranged on the electrical component-contact-surface or on the electrical board-contact-surface, and
wherein the spring connector and the counterpart body are arranged on each other for connecting the electrical heater-function-component with the circuit-board.

3. The connector system according to claim 2, wherein the counterpart body is a protrusion body soldered into the electrical component-contact-surface or the electrical board-contact-surface.

4. The connector system according to claim 3, wherein the protrusion body comprises a cylindrical body, a rectangular body, or a sword body soldered into the electrical component-contact surface.

5. The connector system according to claim 3, wherein the protrusion body comprises a cylindrical body, a rectangular body, or a sword body soldered into the electrical board-contact surface.

6. The connector system according to claim 1, wherein the spring connector of the connector-assembly includes: a connector housing, wherein the connector housing has a joint protrusion defining a longitudinal rotation axis,
wherein a rib connector assembly is arranged on the joint protrusion, and
wherein the rib connector assembly is structured and arranged to receive a counterpart body for flexibly connecting the electrical heater-function-component and the circuit-board.

7. The connector system according to claim 6,
wherein the rib connector assembly includes at least one rib connector, wherein the at least one rib connector is at least one of linearly movable and rotatably mounted on the joint protrusion,
wherein the longitudinal rotation axis defines a stack-direction, and
wherein the at least one rib connector is stacked on each other in close contact in the stack-direction.

8. The connector system according to claim 7, wherein the at least one rib connector includes:
a connector body having at least one connector body leg,
wherein the at least one connector body leg includes two connector body legs defining a clamp gap, the clamp gap structured and arranged for receiving and fixing a counterpart body.

9. The connector system according to claim 8, wherein two further connector body legs are structured and arranged to interact with the connector housing for limiting at least one of a linear movement and a rotatory movement of the at least one rib connector.

10. The connector system according to claim 6, wherein at least one of the rib connector assembly the at least one rib connector of the rib connector assembly are composed of an electrically conductive material.

11. The connector system according to claim 1, wherein the spring connector further comprises a receiving connector for receiving a counterpart body, wherein the receiving connector is connected to the elastic and electrically conductive pin body.

12. The connector system according to claim 1, wherein the elastic and electrically conductive pin body is one of an elastic wire, an elastic spring, and an elastic spring shaped wire.

13. The connector system according to claim 1, wherein the elastic and electrically conductive pin body is attached to at least one of the electrical component-contact-surface and the electrical board-contact-surface.

14. The connector system according to claim 1, wherein at least one of the electrical component-contact-surface and the electrical board-contact-surface are arranged on a pad that is a part of the electrical heater-function-component.

15. The connector system according to claim 1, wherein the electrical component-contact-surface is arranged on a copper pad that is part of the electrical heater-function-component.

16. The connector system according to claim 1, wherein the electrical board-contact-surface is arranged on a copper pad that is part of the electrical heater-function-component.

17. A heater system, comprising:
a heater system housing,
a heater-function-component, the heater-function-component including at least one heater body for heating and a connection portion,
a circuit-board arranged in the heater system housing and having a plurality of component-contact-surfaces for an electrical connection of the heater-function-component, and
a connector-assembly for connecting the heater-function-component and the circuit-board, wherein the connector assembly is arranged at the plurality of component-contact-surfaces for connecting the heater-function-component with the circuit-board, wherein the connector-assembly includes a spring connector that comprises an elastic and electrically conductive pin body for electrically connecting the plurality of component-contact-surfaces and a board-contact-surface of the circuit-board, and wherein the spring connector is elastically prestressed arranged between the plurality of component-contact-surfaces and the electrical board-contact-surface for electrically connecting the plurality of component-contact-surfaces and the board-contact-surface.

18. The heater system according to claim 17, wherein the spring connector is arranged on at least one of the plurality of the component-contact-surfaces, and the connector-assembly further includes a counterpart body arranged on the spring connector for connecting the heat-function-component with the circuit-board.

19. The heater system according to claim 18, wherein the spring connector includes a connector housing having a joint protrusion defining a longitudinal rotation axis, and a rib connector assembly is arranged on the joint protrusion, and wherein the rib connector assembly is structured and arranged to receive the counterpart body for flexibly connecting the electrical heater-function-component and the circuit-board.

20. The heater system according to claim 17, wherein the elastic and electrically conductive pin body is one of an elastic wire, an elastic spring, and an elastic spring shaped wire.

* * * * *